US005211806A

United States Patent [19]

Wong et al.

[11] Patent Number: 5,211,806

[45] Date of Patent: May 18, 1993

[54] MONOLITHIC INKJET PRINTHEAD

[75] Inventors: Kaiser Wong; Anikara Rangappan, both of Torrance, Calif.

[73] Assignee: Xerox Corporation, Stamford, Conn.

[21] Appl. No.: 813,170

[22] Filed: Dec. 24, 1991

[51] Int. Cl.[5] ...................... H01L 21/306; B44C 1/22; C03C 15/00; C23F 1/00

[52] U.S. Cl. .................................. 156/644; 156/653; 156/656; 156/657; 156/659.1

[58] Field of Search ............... 156/644, 650, 652, 653, 156/655, 656, 657, 659.1, 661.1, 668; 346/1.1, 76 PH, 140 R

[56] References Cited

U.S. PATENT DOCUMENTS

| | | | |
|---|---|---|---|
| 4,394,670 | 7/1983 | Sugitani et al. | 346/140 R |
| 4,438,191 | 3/1984 | Cloutier | 346/140 R |
| 4,536,250 | 8/1985 | Ikeda et al. | 156/656 X |
| 4,558,333 | 12/1985 | Sugitani et al. | 346/140 R |
| 4,701,766 | 10/1987 | Sugitani et al. | 346/140 R |
| 5,140,345 | 8/1992 | Komuro | 156/630 X |

*Primary Examiner*—William A. Powell
*Attorney, Agent, or Firm*—Daniel J. O'Neill

[57] ABSTRACT

The present invention is directed to a method for fabricating a monolithic ink jet printhead. The printhead has a substrate with a major surface and a plurality of ink channels formed on the major surface, with the ink channels each having a nozzle at one end and an inlet communicating with an ink manifold at the other end. The printhead has transducers, formed on the major surface and positioned in each ink channel, for creating pressure to move ink through the nozzles. According to the method, first a mandrel of a first metal or metal alloy is formed, on the major surface, that models the ink channels and the ink manifold. Then a first passivation layer is formed on the mandrel and the major surface, and a mandrel cover of a first metal or metal alloy is formed covering the mandrel, separated from the mandrel by the first passivation layer. A nozzle cap is formed over and attached to the mandrel cover by plating the mandrel cover with a third metal or metal alloy. The nozzle cap includes openings or orifices that are substantially coaxially with the transducers. Finally, the mandrel is removed, leaving a void that defines the ink channels and the ink manifold, and leaving the portions of the first passivation layer adjacent to the mandrel cover to protect the mandrel cover from the corrosive effects of ink.

25 Claims, 21 Drawing Sheets

MONOLITHIC INKJET PRINTHEAD

BACKGROUND AND INFORMATION DISCLOSURE STATEMENT

This invention relates to ink jet printheads, and more particularly to monolithic ink jet printheads.

Ink jet printheads create a jet of ink drops by forcing ink, under pressure, through a nozzle. Typical transducers used to pressure the ink include piezoelectric elements (i.e., acoustic ink jet) and heating resistors (i.e., thermal or bubble ink jet). An ink jet printhead usually contains an array of nozzles.

To build printheads, one approach has been to fabricate the nozzles on a separate flat plate, then attach the nozzle plate to a body containing the transducers and channels for the ink. Although this approach generally has proven adequate, it is prone to misalignment between the nozzle plate and body. Moreover, the adhesive used to join the separate parts may clog the nozzles or the channels.

To overcome the disadvantages of constructing the nozzle plate separately, some prior art printheads are constructed with the nozzle plate integral with the body. For example, U.S. Pat. No. 4,394,670, issued to Sugitani et al. on Jul. 19, 1983, U.S. Pat. No. 4,558,333 issued to Sugitani et al. on Dec. 10, 1985, and U.S. Pat. No. 4,701,766 issued to Sugitani et al. on Oct. 20, 1987 all disclose methods for fabricating monolithic printheads using hardened photosensitive resins. U.S. Pat. No. 4,438,191, issued to Cloutier et al. on Mar. 20, 1984, discloses a method of making a monolithic bubble ink jet printhead involving attaching a foundation of conductive material to a substrate, which contains heating resistors, and defining a perimeter/wall combination over the foundation and surrounding the resistors using a resist layer. After electroplating the perimeter/wall combination in place, a flash coat of metal is applied over the resist that is inside the perimeter of the perimeter/wall combination. The desired orifices and the external shape of the part are defined by a second layer of resist. The flash coat is then electroplated with a second layer of metal. Finally, the flash coat and resist layers are removed, leaving a firing chamber defined by the second layer of metal and the perimeter/wall combination, and leaving an orifice within the second layer of metal.

SUMMARY OF THE INVENTION

The present invention is directed to a method for fabricating a monolithic ink jet printhead. The printhead has a substrate with a major surface and a plurality of ink channels formed on the major surface, with the ink channels each having a nozzle at one end and an inlet communicating with an ink manifold at the other end. The printhead has transducers, formed on the major surface and positioned in each ink channel, for creating pressure to move ink through the nozzles. According to the method, first a mandrel of a first metal or metal alloy is formed, on the major surface, that models the ink channels and the ink manifold. Then a first passivation layer is formed on the mandrel and the major surface, and a mandrel cover of a first metal or metal alloy is formed covering the mandrel, separated from the mandrel by the first passivation layer. A nozzle cap is formed over and attached to the mandrel cover by plating the mandrel cover with a third metal or metal alloy. The nozzle cap includes openings or orifices that are substantially coaxially with the transducers. Finally, the mandrel is removed, leaving a void that defines the ink channels and the ink manifold, and leaving the portions of the first passivation layer adjacent to the mandrel cover to protect the mandrel cover from the corrosive effects of ink.

According to another aspect of the invention, the mandrel cover includes a footing that attaches the nozzle cap to the first passivation layer where the first passivation layer is attached to the major surface.

According to other aspects of the invention, the first metal or metal alloy is the metal aluminum and the mandrel cover consists of sputtered aluminum.

According to a final aspect of the invention, the regions of the nozzle cap not adjacent the mandrel cover are covered with a protective plating, preferably of gold.

Other aspects of the invention will become apparent from the following description with reference to the drawings, wherein:

DETAILED DESCRIPTION OF THE PREFERRED EMBODIMENTS

Figure 1:
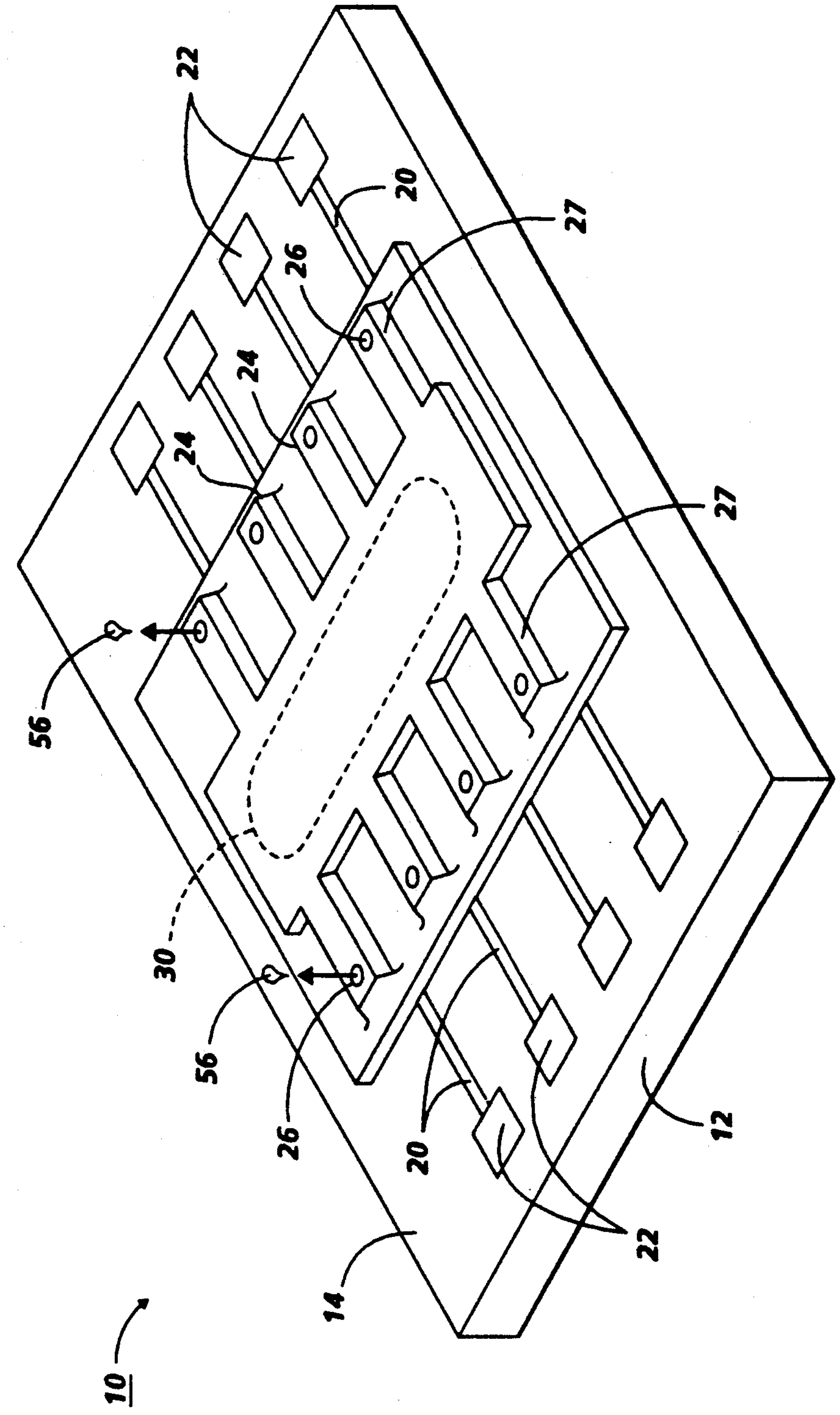
FIG. 1 is a perspective view of a roof shooter thermal ink jet printhead made according to a first preferred embodiment of the method of the present invention.
Figure 13:
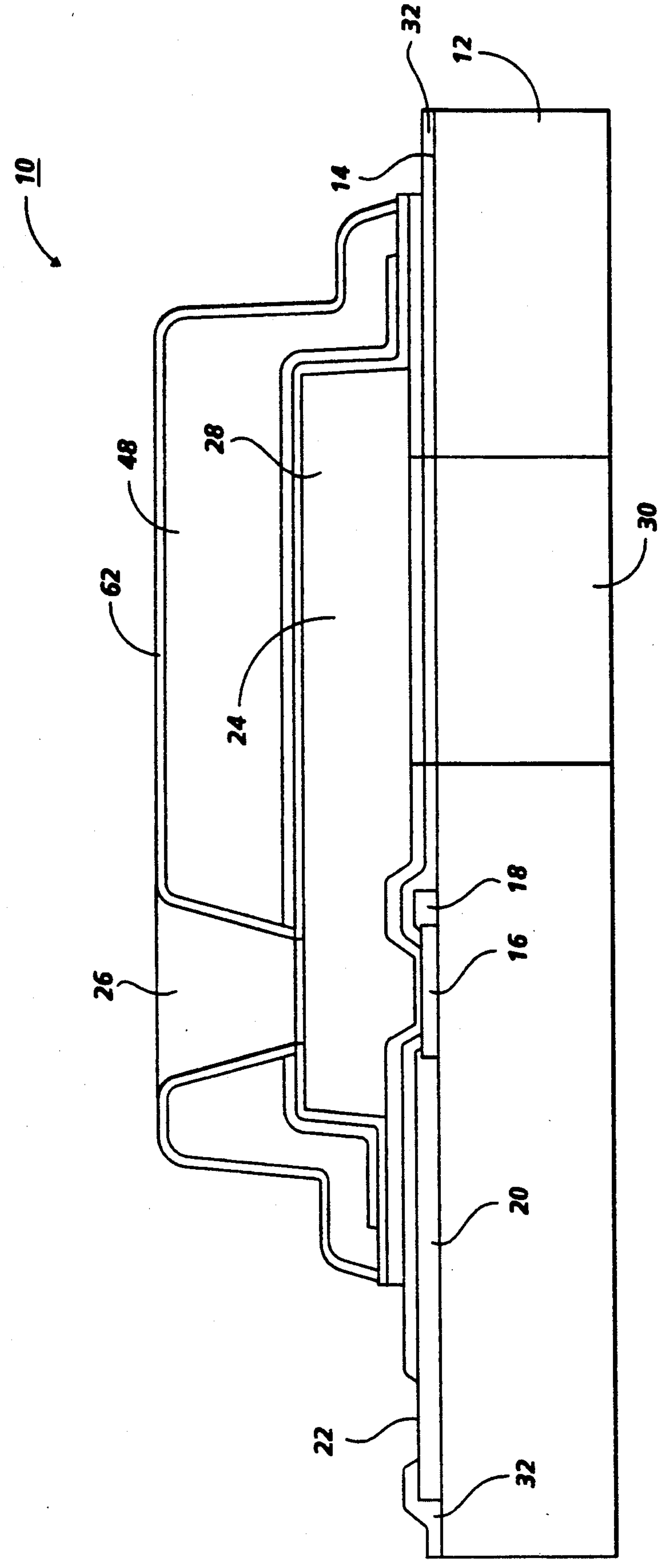
Figure 14:
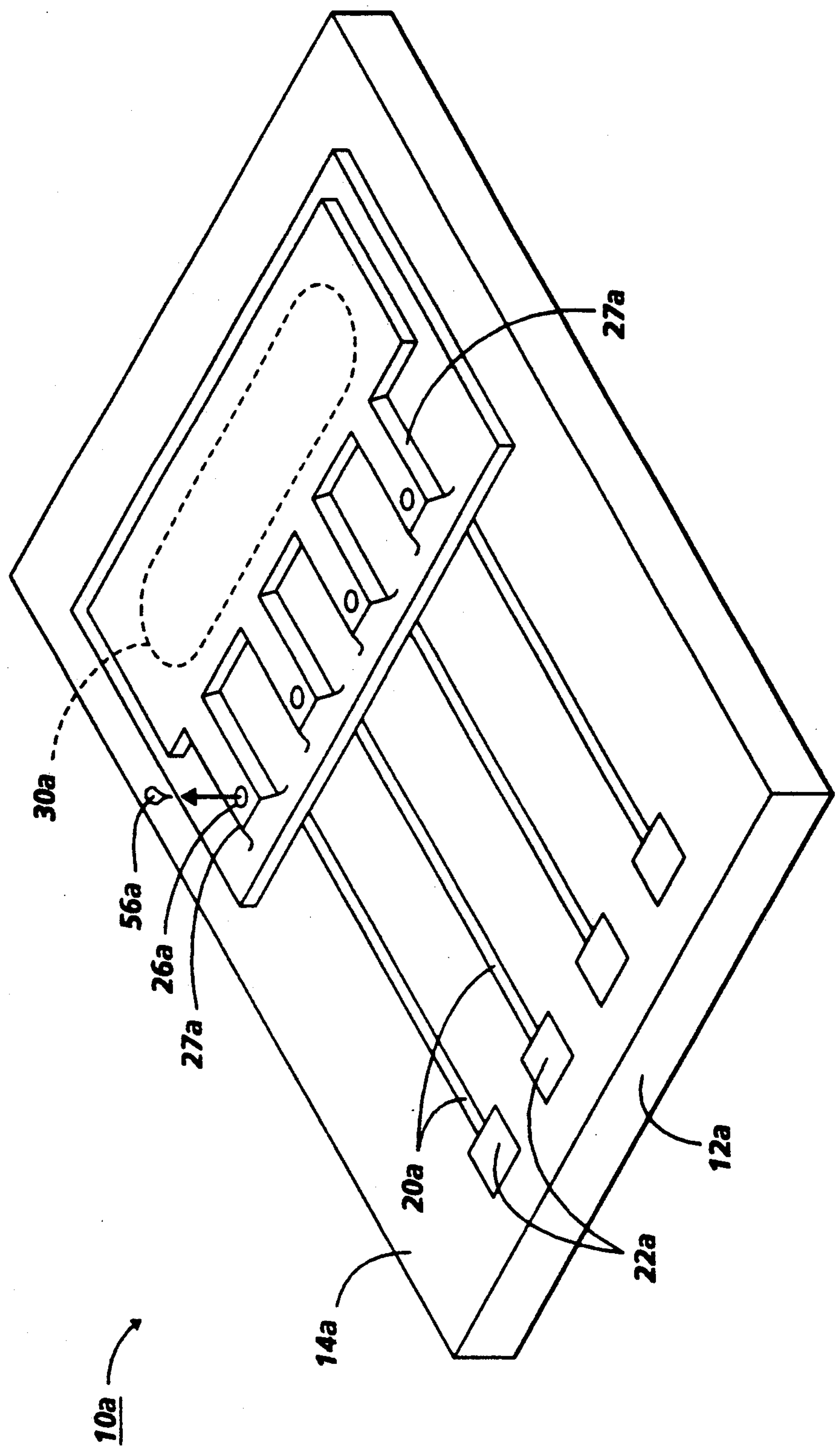
FIG. 14 is a perspective view of a roof shooter themal ink jet printhead made according to a second preferred embodiment of the method of the present invention.
Figure 15:
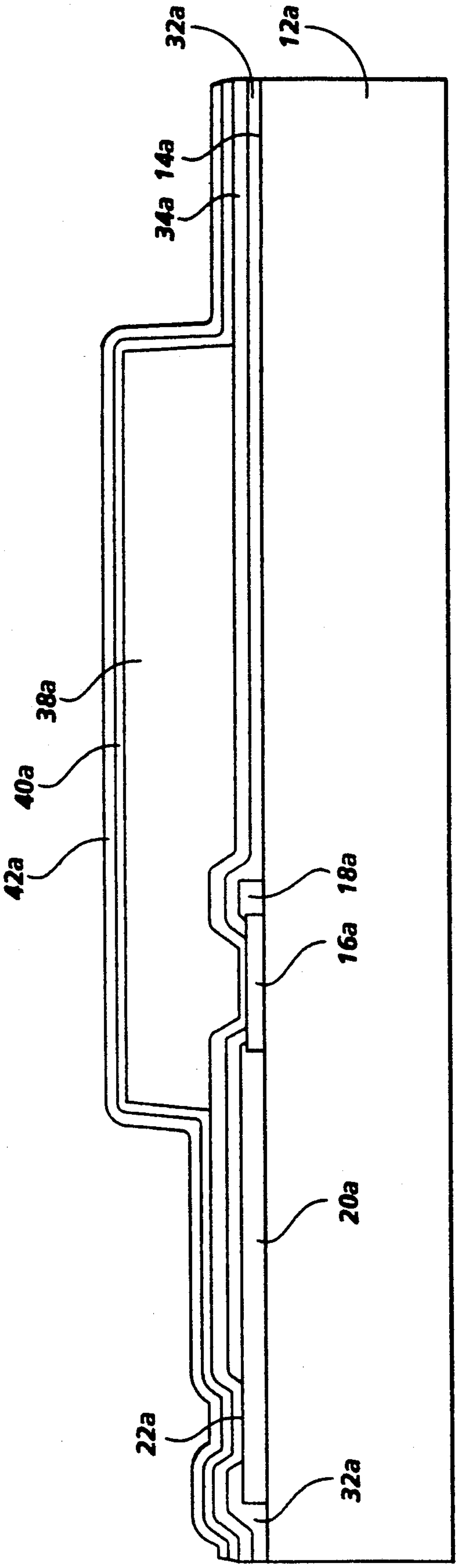
FIGS. 15 through 21 are cross-sectional views showing successive steps in constructing the printhead of FIG. 14.

Referring now to FIGS. 1 and 13, there are shown respective perspective and cross-sectional views of a roof shooter thermal ink jet printhead 10 constructed according to the method of the present invention. Printhead 10 includes a silicon substrate 12 that has a major surface 14 upon which are formed transducers 16, common return 18, addressing electrodes 20 having bonding pads 22. Transducers 16 are selectively supplied current pulses (not shown) through addressing electrodes 20, which each connect to one end of a transducer 16. At the opposite end of the transducer 16, the common return 18 connects to the transducer 16 to provide a return path for the current pulses. Transducers 16 are preferably heating resistors. Another suitable transducer 16 is a piezoelectric element, as used in acoustic ink jet printheads.

Adjacent major surface 14 are a plurality of ink channels 24. Each ink channel 24 includes a nozzle 26 at one end, with the nozzle 26 positioned so that it is substantially coaligned with a heating resistor 16. Printhead 10 includes two staggered linear arrays 27 of nozzles 26. Alternatively, there could be only a single linear array 27, or more than two linear arrays 27. At the end of each channel 24 opposite the nozzle 26, the ink channel 24 communicates with an ink manifold 28, shown in FIG. 13. The ink manifold 28 is fed ink through a fill hole 30 which communicates with an ink reservoir (not shown).

Heating resistors 16 include a protective covering, a 0.1 micrometer thick protective region (not shown).

The protective region typically consists of either a silicon nitride or silicon dioxide layer, or both, capped by a 5000 angstrom thick layer of tantalum. The protective region protects the heating resistor 16 from corrosive and cavitational effects. Similarly, a passivation layer 32 covers and protects the electrodes 20, common return 18, and portions of major surface 14. However, passivation layer 32 does not cover the central portions of heating resistors 16, to allow better transfer of heat from heating resistor 16 to the ink.

Figure 2:
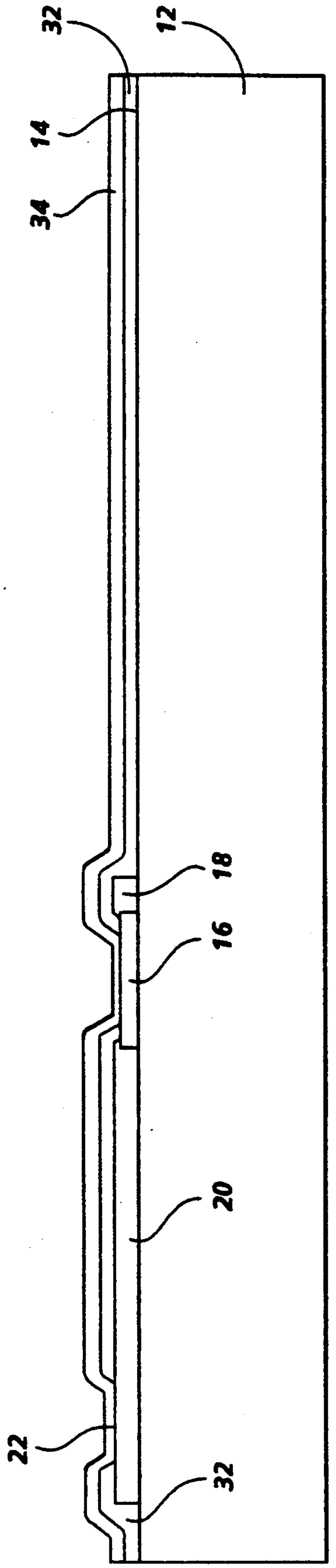
FIGS. 2 through 13 are cross-sectional views showing successive steps in constructing the printhead of FIG. 1.

Referring now to FIGS. 1 through 13, there are shown steps for constructing printhead 10 according to a first preferred embodiment of the present invention. Referring now to FIG. 2, a passivation layer 34 is formed over major surface 14 to protect the underlying structures, including common return 18, electrodes 20, and heating resistors 16. Passivation layer 34 consists of a 2 micrometer thick layer of silicon dioxide. Other material that can be used to construct passivation layer 32 include silicon nitride and polyimide.

Figure 3:
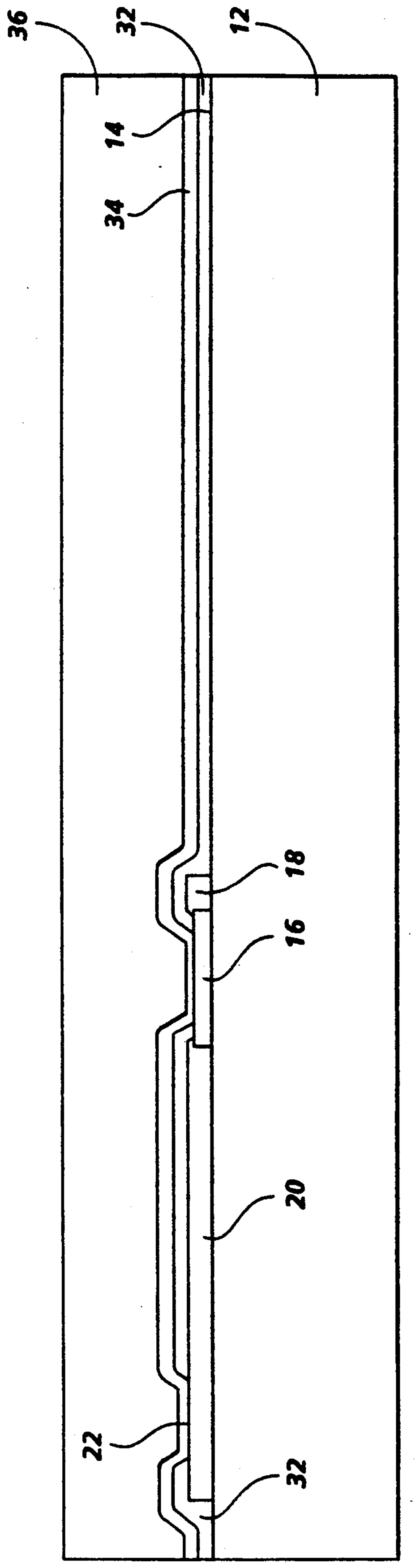
Figure 4:
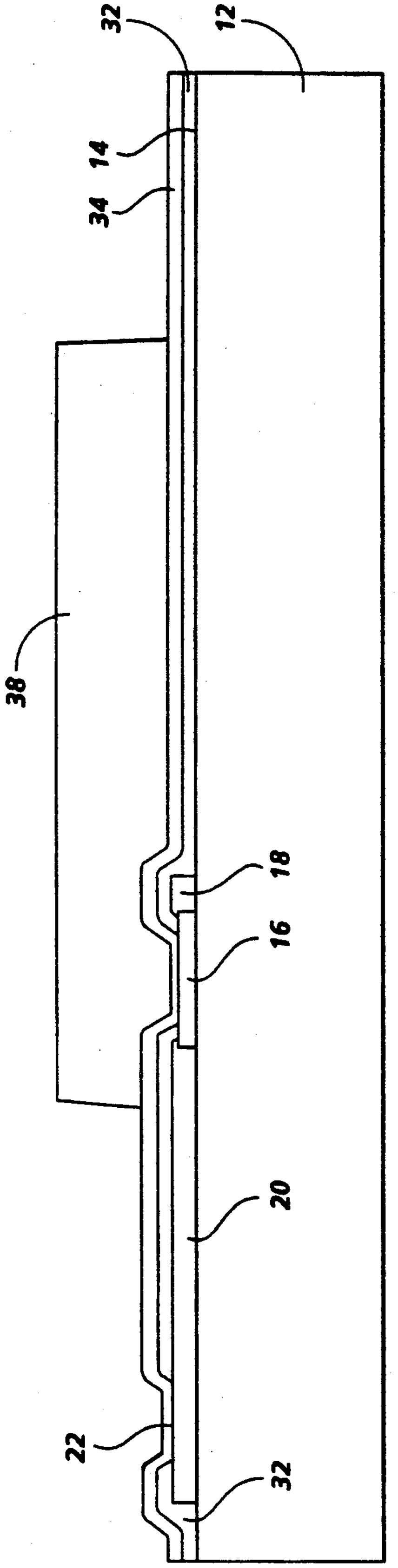

Next, as shown in FIGS. 3 and 4, a layer 36 of metal or metal alloy is formed on passivation layer 34, then patterned and etched to form mandrel 38. Preferably, layer 36 consists of aluminum, and is 25 to 60 micrometers thick, with 25 micrometers being typical. Mandrel 38 models the ink channels 24 and ink manifold 28. The thickness of aluminum layer 36 determines the depth of ink channels 24 and manifold 28. Aluminum layer 36 can be formed by sputtering, or other suitable techniques.

Figure 5:
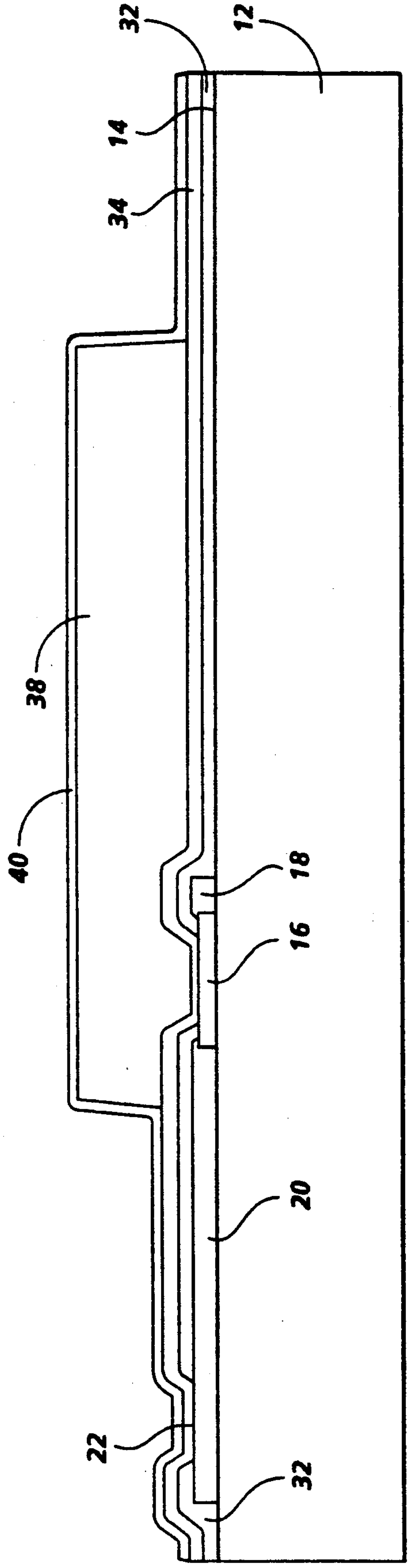

A passivation layer 40 is then formed on major surface 14 over mandrel 38 and the portions of passivation layer 34 not covered by mandrel 38, as shown in FIG. 5. Passivation 40 is constructed of a different material than passivation layer 34, so that portions of passivtion layer 40 can be later removed using an etchant that does not significantly etch passivation layer 34. Preferably, passivation layer 40 consists of a 1.5 micrometer thick layer of deposited silicon nitride.

Figure 6:
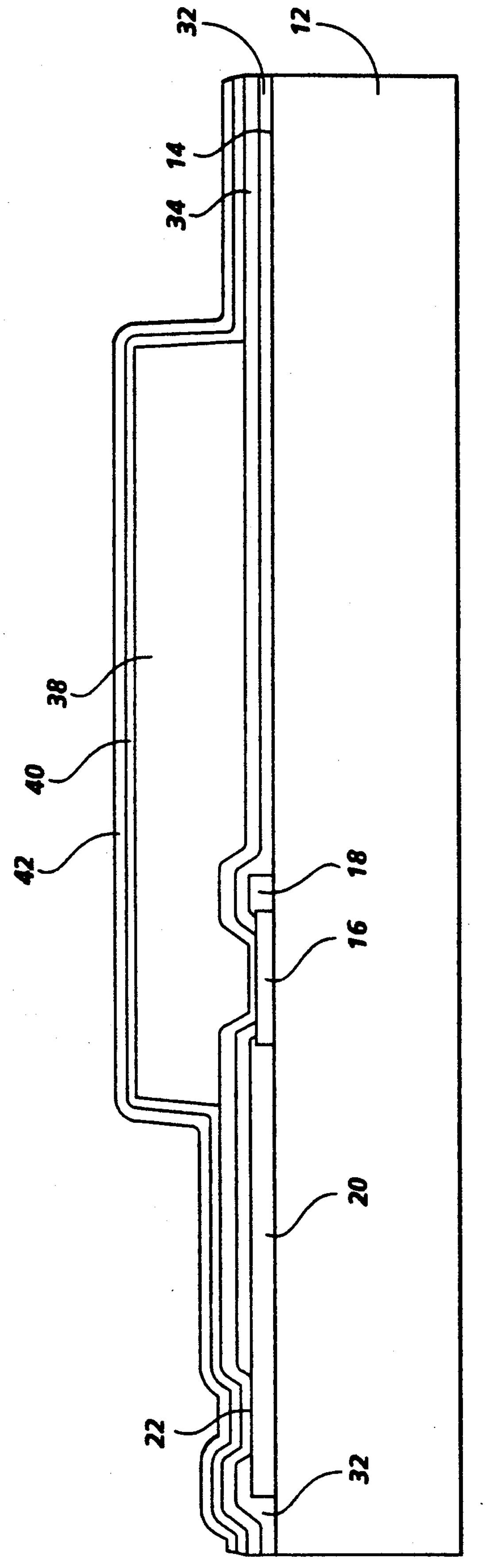
Figure 7:
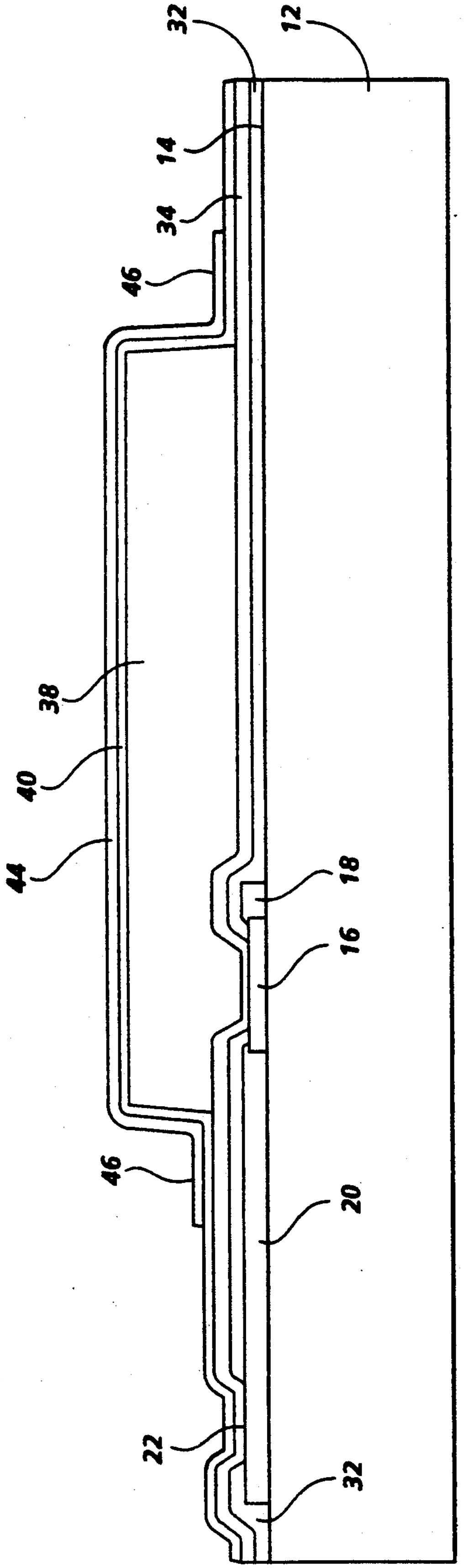

Next, referring now to FIG. 6, a conductive layer 42 is formed over passivation layer 40. Preferably, layer 42 consists of a 1 micrometer thick layer of sputtered aluminum. The sputtered aluminum adheres well to the underlying passivation layer 40. Layer 42 is patterned and etched to form covering 44, as shown in FIG. 7. Covering 44 covers the underlying mandrel 38, as well as footings 46 along the periphery of the underlying mandrel 38. Footings 46 serve to attach covering 44 to the underlying passivation layer 40.

Figure 8:
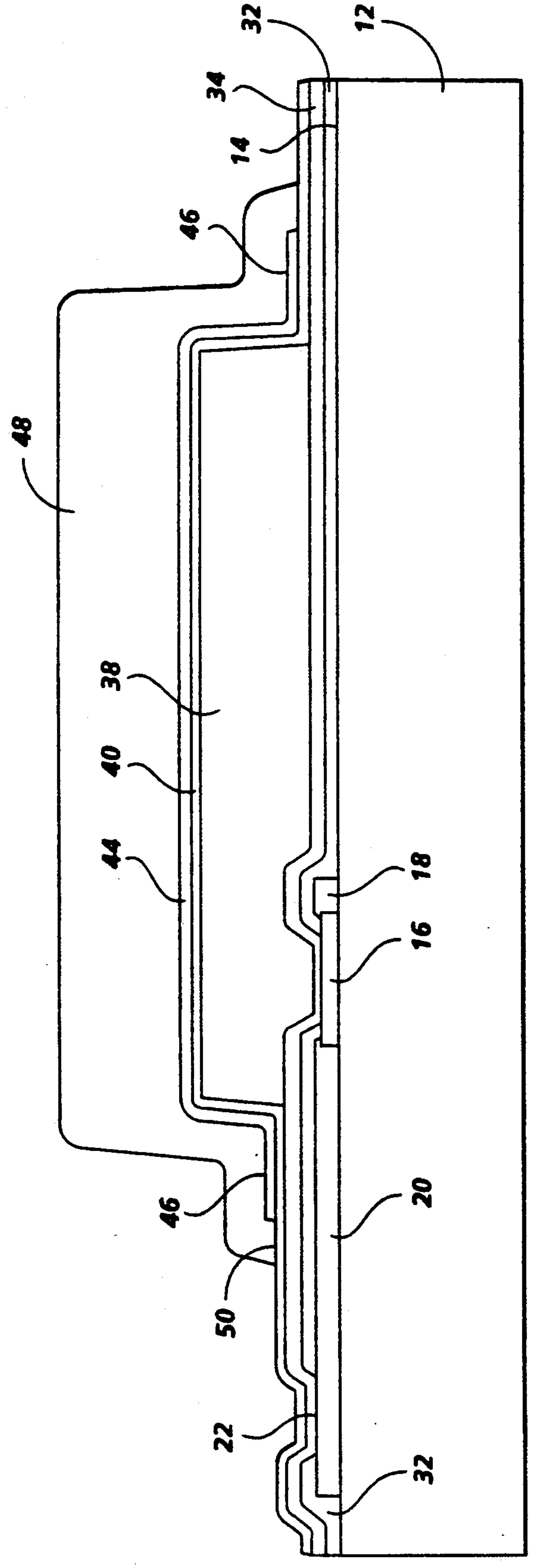

Referring now to FIG. 8, next covering 44 is covered by a conductive nozzle cap 48. Cap 48 is preferably made of nickel and constructed by means of electroless plating, a technique that firmly attaches the nickel plating material to the conductive aluminum covering 44, including footing 46. Alternatively, cap 48 can be constructed of another metal, such as cobalt, or of a metal alloy, e.g., a nickel alloy containing phosphorous or sulfur. Preferably, cap 48 measures about 75 micrometers thick, with the thickness of cap 48 being measured at a portion of cap 48 lying directly above heating resistors 16. The thickness of cap 48 effects the size and shape of nozzles 26.

At its base, cap 48 covers footing 46, thereby securing cap 48 to major surface 14 by the adhesion between cap 48 and covering 44 at footings 46. Cap 48 also extends beyond the region 50 of passivation layer 40 that adjoins covering footing 46, but here cap 48 only weakly adhears to passivation layer 40.

Figure 9:
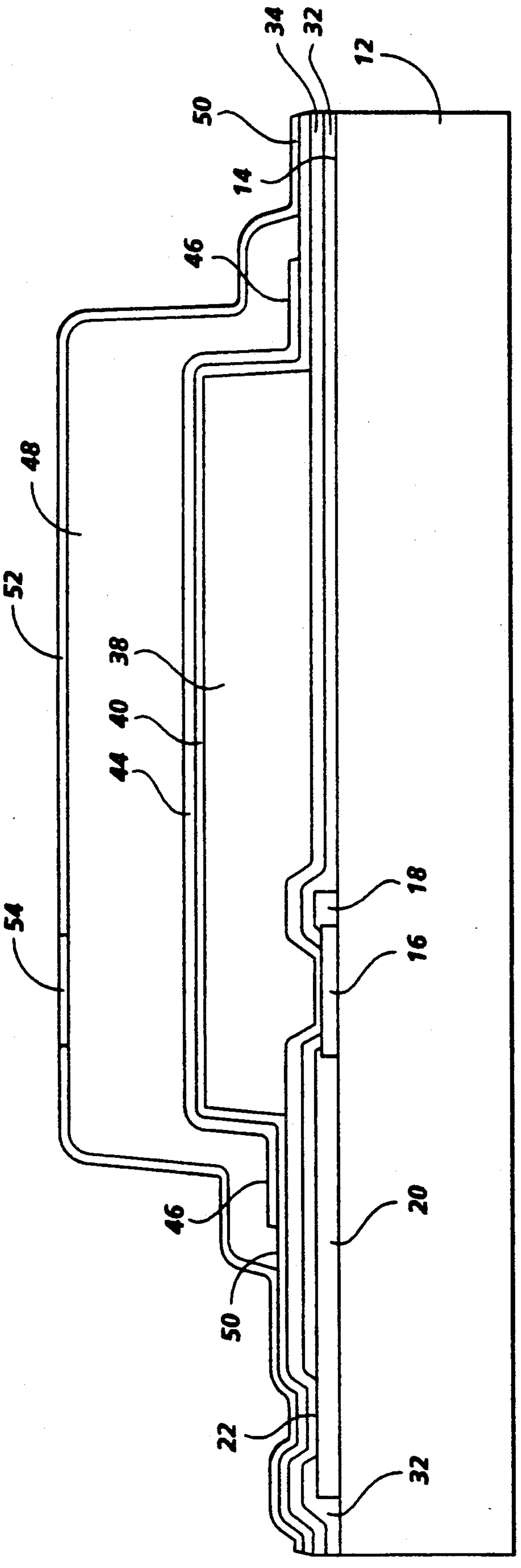

Next, referring now to FIGS. 9 and 13, to define the location of nozzles 26 a masking layer 52, consisting of photoresistor polyimide, is deposited, then patterned and etched to create openings 54 in masking layer 52. Openings 54 are circular in shape, preferably with a diameter of about 40 micrometers, and are substantially coaxially with heating resistors 16 for proper ejection of ink droplets 56, as shown in FIG. 1. The diameter of openings 54 affects the size of nozzles 26.

Figure 10:
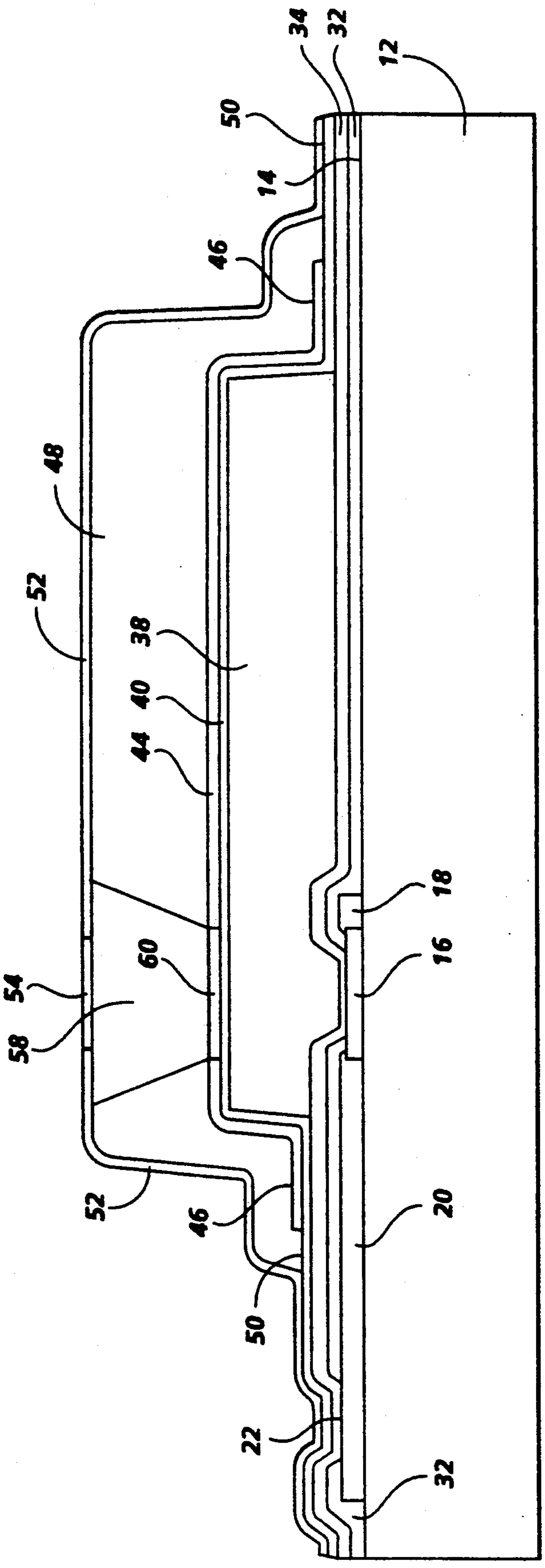

Once openings 54 are formed, etchants are used to remove the portions of nickel nozzle cap 48 and aluminum mandrel covering 44 that underlie openings 54. After the etching, masking layer 52 is removed. Referring now to FIG. 10, the etchings form apertures 58 and 60 in cap 48 and covering 44, respectively. Apertures 58 and 60 are substantially coaxially with associated opening 54 and heating resistor 16. The etchants undercut masking layer 52, causing aperture 58 to be funnel-shaped: aperture 58 has its widest diameter, 60 micrometers, adjacent opening 54, and tapers to its smallest diameter, about 40 micrometers, adjacent opening 60. Opening 60 has a diameter of about 40 micrometers. In addition to factors mentioned previously, the size of apertures 58 and 60 is also effected by the duration of the etching step.

Figure 11:
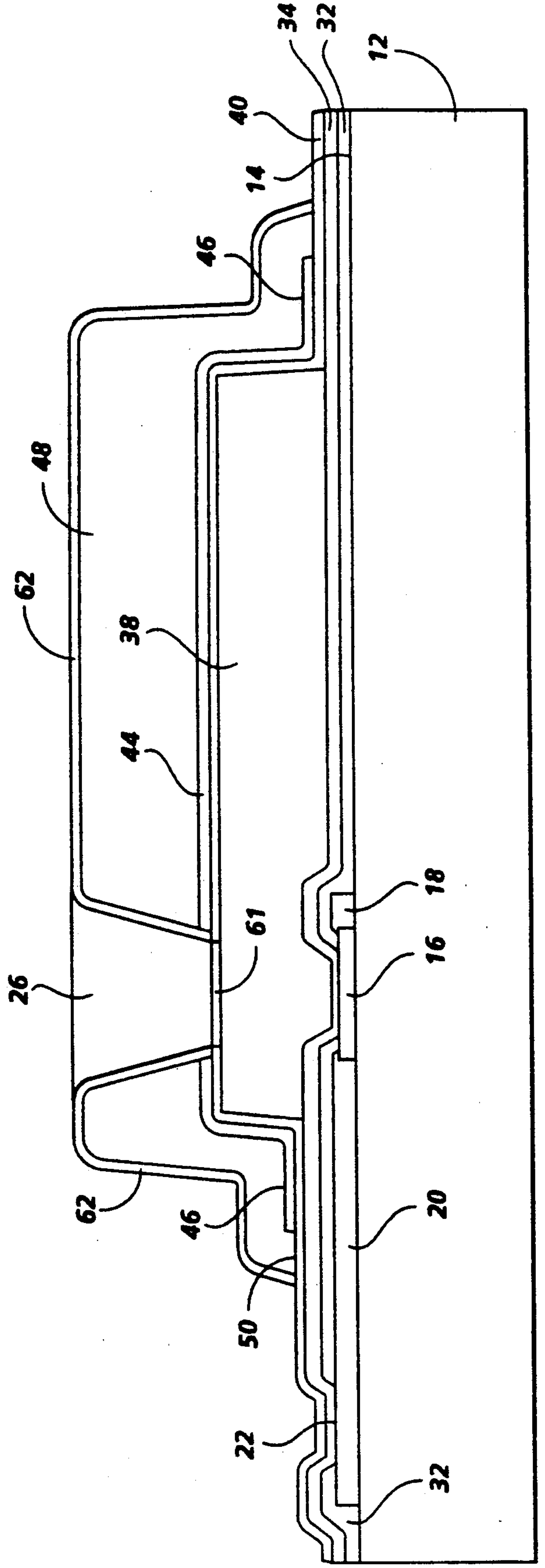

After apertures 58 and 60 are formed, masking layer 52 is removed and an electroless plating process is used to plate a 1 micrometer thick layer 62 of gold over the perimeters of apertures 58 and 60, as well as over the other exposed surfaces of cap 48, as shown in FIG. 11. Gold is the preferred material for providing bimetallic protection. Alternatively, the step of plating gold layer 62 can be omitted, provided cap 48 is constructed of nickel, cobalt or their alloys, which form protective oxides in alkaline media, such as most ink jet inks. Although passivation layer 40 prevents the plating of portions of mandrel cover 44 adjacent adjacent passivation layer 40, passivation layer 40 itself adequately protects these portions of mandrel cover 44.

Next, the portions of passivation layer 40 not shielded by cap 48 are etched away, including the portion 61 of passivation layer 40 that separates mandrel 38 from the now-completed nozzles 26. The etchant used is selected to etch the material of passivation layer 40, silicon nitride, while not etching in any significant amount the material of passivation layer 34, silicon dioxide.

Figure 12:
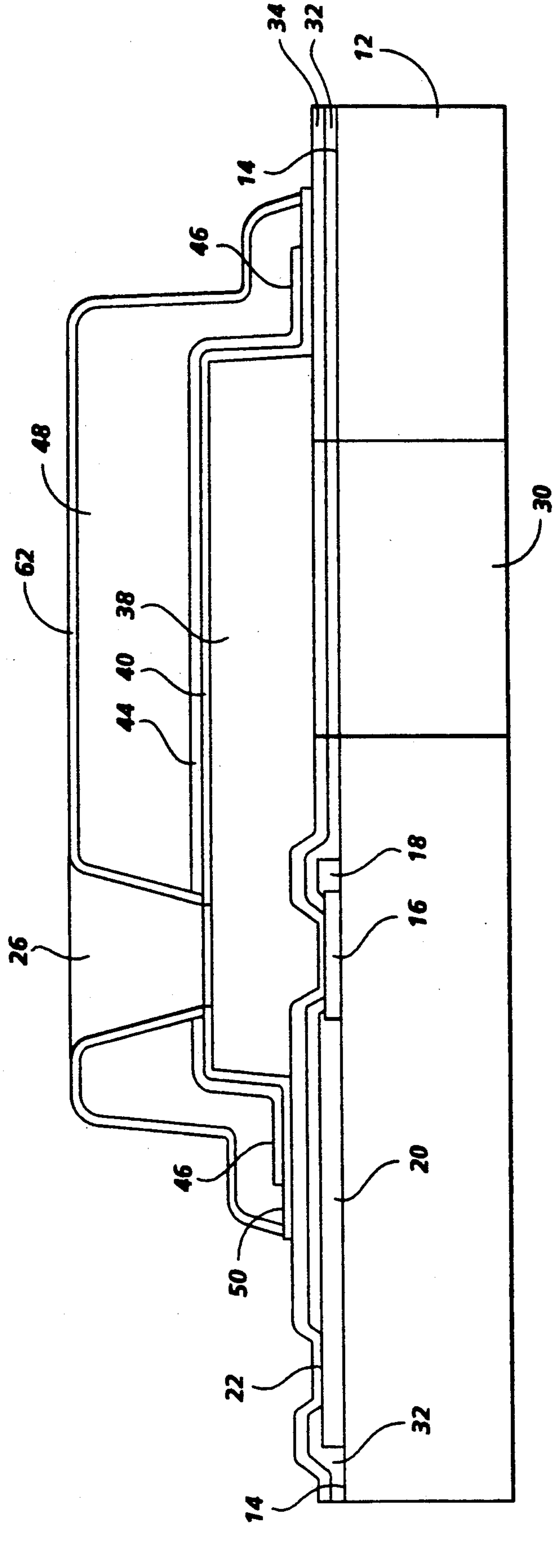

A fill hole 30 is laser drilled through substrate 12 and passivation layers 32 and 34, to reach mandrel 38, as shown in FIG. 12. Next, aluminum mandrel 38 is removed by etching. Although the aluminum mandrel 38 is etched away, aluminum interconnects 20 and common 18 are protected or masked from etching by passivation layers 34 and 32. Similarly, aluminum mandrel cover 44 is protected from etching by the adjacent portions of passivation layer 40 and nickel nozzle cap 48. Finally, passivation layer 34 is removed by an etching process, leaving exposed bonding pads 22 and heating resistors 16, as shown in FIG. 13.

Referring now to FIGS. 14 through 21, there is shown in FIG. **14*a* perspective view of a roof shooter thermal ink jet printhead 10*a* constructed according to a second preferred embodiment of the present invention, and in FIGS. 15 through 21 there are shown cross-sectional views of successive steps for constructing printhead 10*a*. In FIGS. 14 through 21, elements of the second embodiment are numbered the same as the corresponding elements of the first embodiment, except that the letter a has been added to the numeral of the elements of the second embodiment (e.g., printhead 10 in FIG. 1 becomes printhead 10***a* in FIG. 14). Printhead 10*a* and printhead 10 have the same construction steps through the steps depicted in FIG. 6 for printhead 10.

Figure 16:
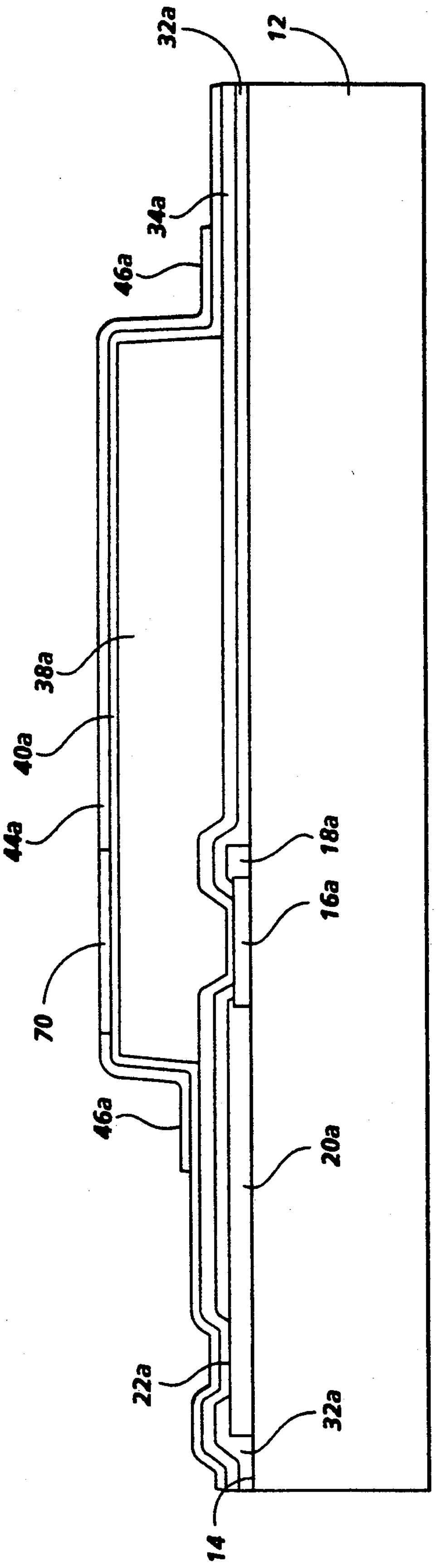

According to the method of the second preferred embodiment, after aluminum is sputtered over passivation layer 40*a* to form layer 42*a*, layer 42*a* is patterned and etched to form mandrel cover 44*a*, as shown in FIG. 16. Mandrel cover 44*a* includes footers 46*a* and orifices 70. Orifices 70 define the location of nozzles 26*a*, and are substantially coaxial with heating resistors 16*a*. Orifices 70 are each circular in shape, with a diameter of 80 micrometers. The diameter of orifices 70 affect the size of nozzles 26*a*.

Figure 17:
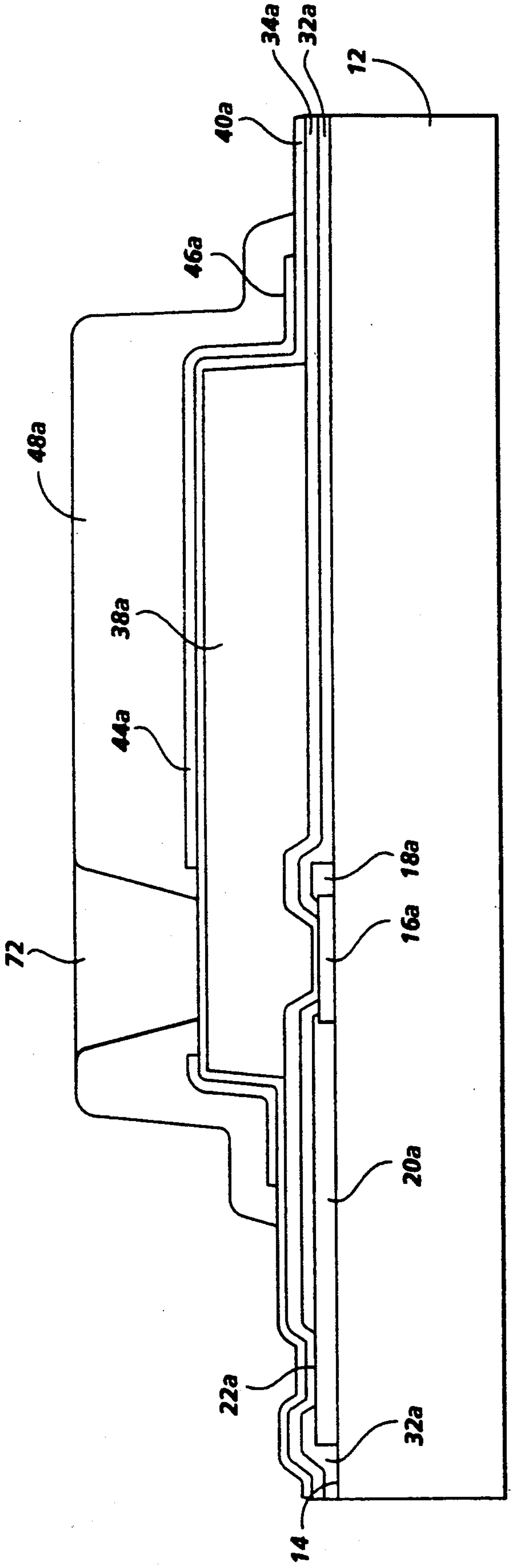
Figure 18:
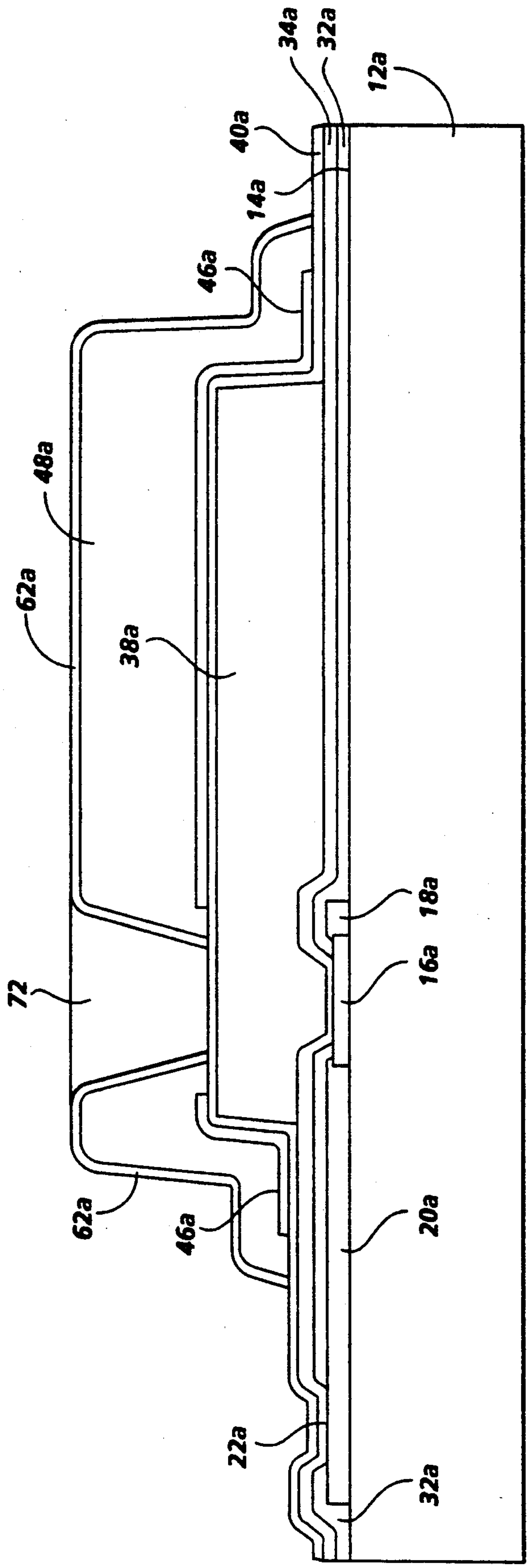

Next, conductive cap 48*a* is formed over cover 44*a* by means of electroless plating of a 75 micrometer thick layer of nickel onto aluminum cap 48*a*, as shown in FIG. 17. Conductive cap 48*a* includes openings 72 that are substantially coaxial with orifices 70. Openings 72 are formed in the course of plating cap 48*a*. The nickel only plates cap 48*a*, because cap 48*a* is conductive, and does not plate the portions of passivation layer 40*a* underlying orifices 70. As the nickel cap 48*a* reaches and plates above the top of orifices 70, the plating begins to creep inwardly across the top edges of orifices 70, since the nickel around the edges of orifices 70 is conductive, inducing plating in a radial direction across the top of the orifice 70 as well as in the outward direction away from major surface 14*a*. The plating is continued until the openings 72 adjacent passivation layer 40*a* have been closed by the nickel to the exact diameters desired for forming and defining nozzles 26*a*. Preferably, the diameter of openings 72 adjacent passivation layer 40*a* is 60 micrometers. Openings 72 are cone shaped, with the narrower end of the cone located adjacent passivation layer 40*a*. At their widest, openings 72 are slightly greater than 60 micrometers in diameter. Next, a layer 62*a* of 1 micrometer thick gold is electroless plated onto cap 48*a*, as shown in FIG. 18.

Figure 19:
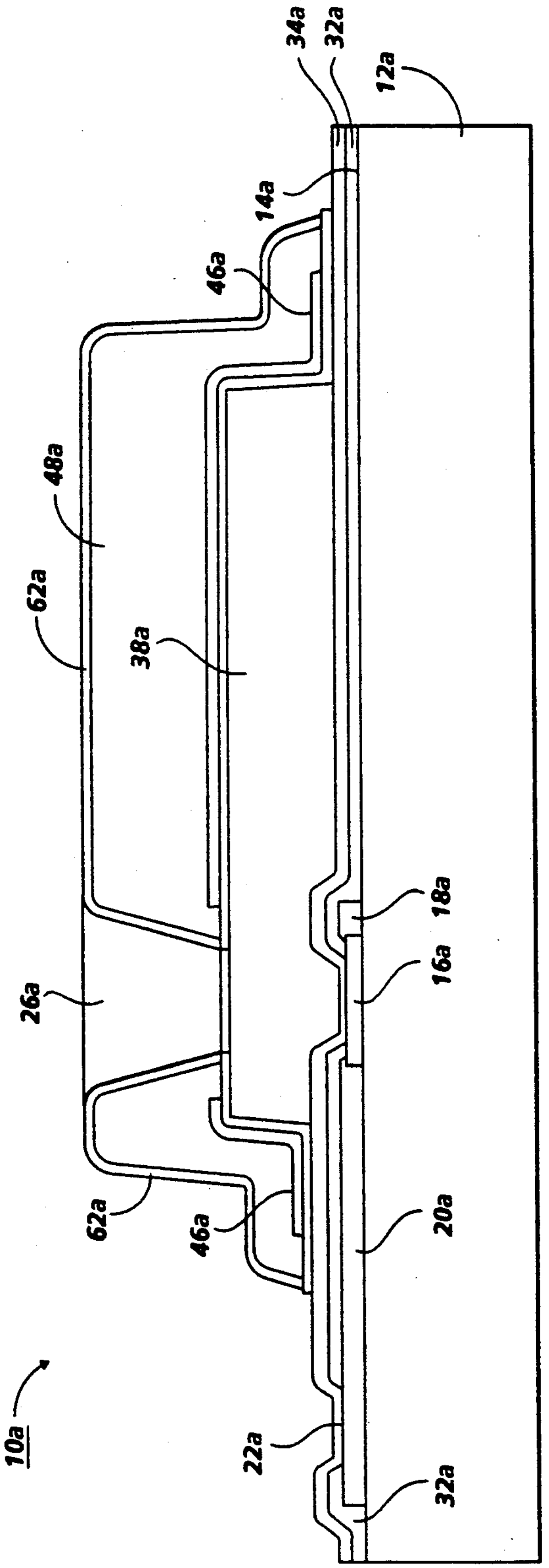
Figure 20:
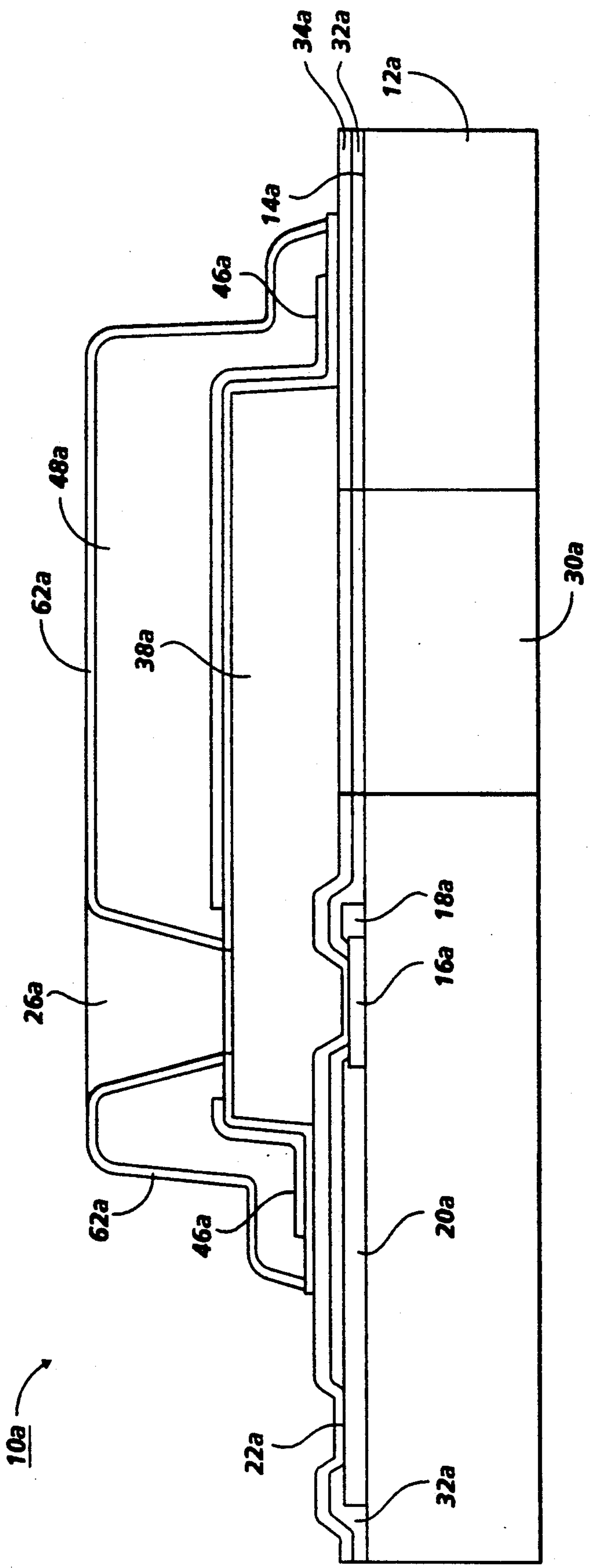
Figure 21:
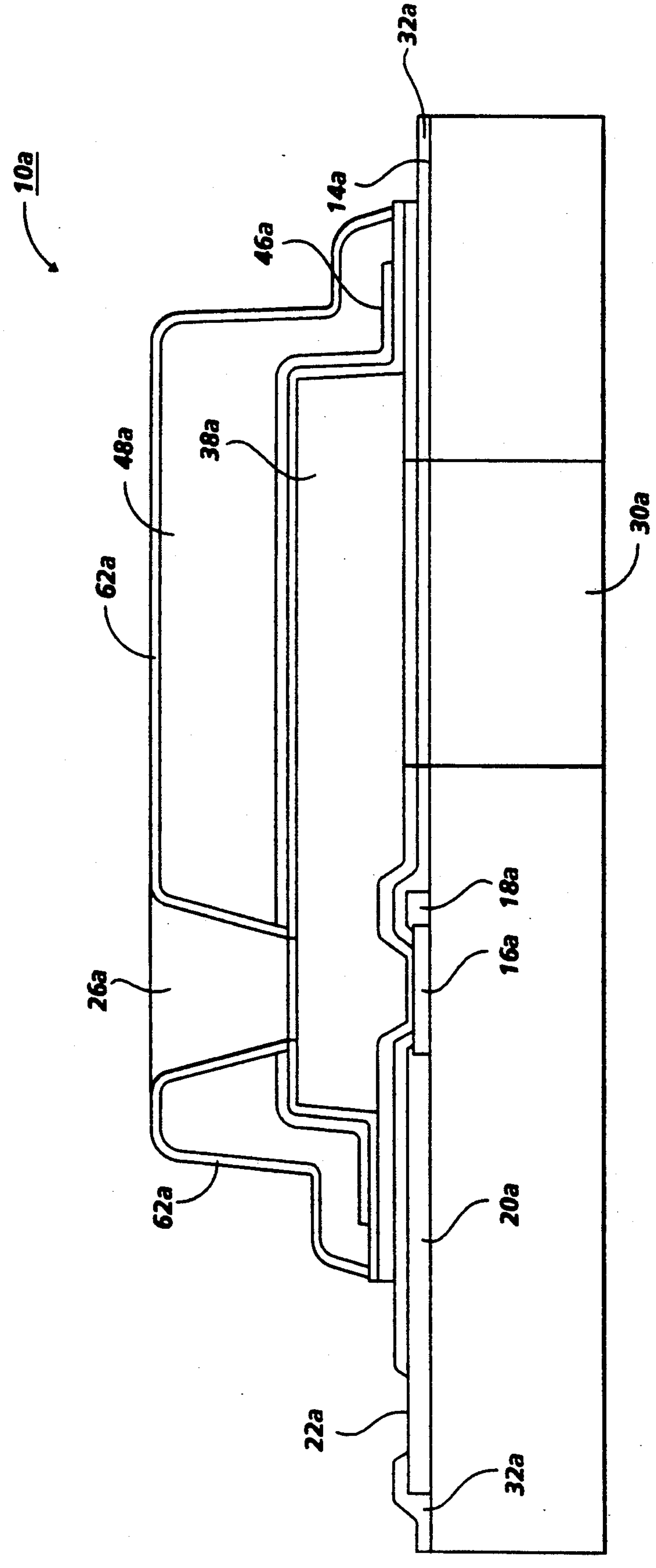

Next, the portions of passivation layer 40*a* not shielded by cap 48*a* are etched away, including the portion of passivation layer 40*a* that separates mandrel 38*a* from nozzle 26*a*, as shown in FIG. 19. A fill hole 30*a* is laser drilled through substrate 12*a* and passivation layers 32*a* and 34*a*, to reach mandrel 38*a*, as shown in FIG. 20. Next, aluminum mandrel 38*a* is removed by etching. Finally, passivation layer 34*a* is etched away, leaving exposed bonding pads 22*a* and heating resistors 16*a*, as shown in FIG. 21.

Although printheads 10 and 10*a* are roofshooters, the method of the invention can also be applied to a printhead which has nozzles oriented in many different directions other than perpendicular to the major surface of a substrate (e.g., a sideshooter ink jet printhead), simply by changing the respective orientations of openings 54, and of orifices 70 and openings 72.

In summary, the present invention provides a method for fabricating a monolithic ink jet printhead 10. Printhead 10 has a substrate 12 with a major surface 14 and a plurality of ink channels 24 formed on the major surface 14, with the ink channels 24 each having a nozzle 26 at one end and an inlet communicating with an ink manifold 28 at the other end. Transducers 16 are formed on the major surface 14 and positioned in each ink channel 24 for creating pressure to move ink through the nozzles 26. According to the method, first a mandrel 38 is constructed over the major surface of a first metal or metal alloy that models the ink channels 24 and the ink manifold 28. Then a passivation layer 40 is formed over the mandrel 38 and the major surface 14, and a mandrel cover 44 of a second metal or metal alloy is formed over the mandrel 38 that covers the mandrel 38, separated from the mandrel 38 by passivation layer 40. A nozzle cap 48 is formed over and attached to the mandrel cover 44. The nozzle cap 48 includes orifices 58 that are substantially coaxially with the tranducers 16. Finally, mandrel 38 is removed by an etching process, leaving a void that defines ink channels 24 and ink manifold 28, and leaving the portions of the passivation layer 40 adjacent to the mandrel cover 44 to protect the mandrel cover 44 from the corrosive effects of ink.

While the invention has been described with reference to the structures disclosed, it is not confined to the specific details set forth, but is intended to cover such modifications or changes as may come within the scope of the claims.

What is claimed is:

1. A method for fabricating a monolithic ink jet printhead, the printhead having a substrate with a major surface, a plurality of ink channels formed on the major surface, the ink channels each having a nozzle at one end and an inlet communicating with an ink manifold at the other end, and transducers formed on the major surface and positioned in the ink channels for creating pressure to move ink through the nozzles, the method comprising the steps of:

a. forming on the major surface a mandrel of a first metal or metal alloy, the mandrel modeling the ink channels and the ink manifold;

b. forming a first passivation layer over the mandrel and the major surface, the first passivation layer being attached to the major surface;

c. forming a mandrel cover of a second metal or metal alloy adjacent the mandrel, the mandrel cover attached to the first passivation layer and separated from the mandrel by the first passivation layer;

d. forming a nozzle cap of a third metal or metal alloy over the mandrel cover, the nozzle cap being attached to the mandrel cover and including openings that are substantially coaxially with the respective transducers; and e. removing the mandrel to leave a void defining the ink channels and the ink reservoir, with portions of the mandrel cover facing the ink channels and ink manifold being protected from corrosion by the first passivation layer.

2. The method according to claim 1 wherein the step c of forming a mandrel cover includes providing the mandrel cover with a footing that is attached to the first passivation layer.

3. The method according to claim 1 wherein the second metal or metal alloy is the metal aluminum, and the step c of constructing a mandrel cover includes depositing the aluminum on the first passivation layer by means of sputtering.

4. The method according to claim 1 wherein the third metal or metal alloy is the metal alloy nickel phosphorus.

5. The method according to claim 1, further including the step of plating the nozzle cap with a fourth metal or metal alloy.

6. The method according to claim 5, wherein the fourth metal or metal alloy is the metal gold.

7. The method according to claim 1, wherein the step d of forming a nozzle cap includes plating the third metal or metal alloy onto the mandrel cover.

8. The method according to claim 7, wherein the step d of plating the third metal or metal alloy onto the mandrel cover is performed by electroless plating.

9. The method according to claim 1, wherein the step d of forming a nozzle cap includes forming openings in the mandrel cover, the openings being substantially coaxial with the transducers, then plating the mandrel cover with the third metal or metal alloy.

10. The method according to claim 9, wherein the step d of plating the mandrel cover is performed by electroless plating.

11. The method according to claim 1, wherein the step d of forming a nozzle cap includes forming a layer of the third metal or metal alloy over the mandrel cover, then etching openings in the third metal or metal alloy layer, the openings being substantially coaxial with the transducers.

12. A method for fabricating a monolithic ink jet printhead, the printhead having a substrate with a major surface, a plurality of ink channels formed on the major surface, the ink channels each having a nozzle at one end and an inlet communicating with an ink manifold at the other end, and transducers formed on the major surface and positioned in the ink channels for creating pressure to move ink through the nozzles, the method comprising the steps of:

a. forming a first passivation layer over the major surface;
b. forming a layer of a first metal or metal alloy over the first passivation layer;
b. patterning and etching the first metal or metal alloy layer to construct a mandrel that models the ink channels and the ink manifold;
c. forming a second passivation layer over the major surface and the mandrel;
d. forming a layer of a second metal or metal alloy over the second passivation layer;
e. patterning and etching the second metal or metal alloy layer to define a cover over the mandrel, separated from the mandrel by the second passivation layer;
f. plating a layer of a third metal or metal alloy over the mandrel cover;
g. patterning the third metal or metal alloy layer, then etching the third and second metal or metal alloy layers to form openings in the respective third and second metal or metal alloy layers that are substantially coaxially with the transducers;
i. removing the portion of the second passivation layer that separates the openings from the mandrel; and
j. removing the mandrel to leave a void defining the ink channels and the ink reservoir, with portions of the mandrel cover facing the ink channels and ink manifoldbeing protected from corrosion by the second passivation layer.

13. The method according to claim 12 wherein the step e of defining a mandrel cover includes providing the mandrel cover with a footing that is attached to the first passivation layer.

14. The method according to claim 12 wherein the second metal or metal alloy is aluminum, and the step c of constructing a mandrel cover includes depositing the aluminum on the first passivation layer by means of sputtering.

15. The method according to claim 12 wherein the third metal or metal alloy is the metal alloy nickel phosphorus.

16. The method according to claim 12, further including the step of plating the nozzle cap with a fourth metal or metal alloy.

17. The method according to claim 16, wherein the fourth metal or metal alloy is the metal gold.

18. A method for fabricating a monolithic ink jet printhead, the printhead having a substrate with a major surface, a plurality of ink channels formed on the major surface, the ink channels each having a nozzle at one end and an inlet communicating with an ink manifold at the other end, and transducers formed on the major surface and positioned in the ink channels for creating pressure to move ink through the nozzles, the method comprising the steps of:

a. forming a first passivation layer over the major surface;
b. forming a layer of a first metal or metal alloy over the first passivation layer;
b. patterning and etching the first metal or metal alloy layer to construct a mandrel that models the ink channels and the ink manifold;
c. forming a second passivation layer over the major surface and the mandrel;
d. forming a layer of a second metal or metal alloy over the second passivation layer;
e. patterning and etching the second metal or metal alloy layer to define a cover over the mandrel, separated from the mandrel by the second passivation layer, the mandrel cover including openings substantially coaxial with the transducers;
f. plating a layer of a third metal over the mandrel cover to form a nozzle cap, the plating forming orifices in the nozzle cap substantially coaxial with the openings in the mandrel cover and the transducers;
g. removing the portion of the first passivation layer that separates the nozzle cap orifices from the mandrel and removing the mandrel to leave a void defining the ink channels and the ink reservoir, with portions of the mandrel cover facing the ink channels and ink manifold being protected from corrosion by the second passivation layer.

19. The method according to claim 18 wherein the first metal or metal alloy is the metal aluminum.

20. The method according to claim 18 wherein the second metal or metal alloy is the metal aluminum.

21. The method according to claim 20, wherein the step d of forming a layer of aluminum includes depositing the aluminum on the second passivation layer by means of sputtering.

22. The method according to claim 18 wherein the third metal or metal alloy is nickel.

23. The method according to claim 18, further including the step of plating the nozzle cap with a fourth metal or metal alloy.

24. The method according to claim 23, wherein the fourth metal or metal alloy is the metal gold.

25. The method according to claim 23, wherein the plating performed is electroless plating.

* * * * *